(12) United States Patent
Lin

(10) Patent No.: US 8,377,813 B2
(45) Date of Patent: Feb. 19, 2013

(54) SPLIT WORD LINE FABRICATION PROCESS

(75) Inventor: Chih-Hao Lin, Taichung (TW)

(73) Assignee: Rexchip Electronics Corporation, Houli Township, Taichung County (TW)

(*) Notice: Subject to any disclaimer, the term of this patent is extended or adjusted under 35 U.S.C. 154(b) by 323 days.

(21) Appl. No.: 12/870,612

(22) Filed: Aug. 27, 2010

(65) Prior Publication Data
US 2012/0052668 A1    Mar. 1, 2012

(51) Int. Cl.
*H01L 21/3205* (2006.01)

(52) U.S. Cl. ........ 438/589; 438/212; 438/259; 438/270; 257/E21.19

(58) Field of Classification Search ............ 438/212, 438/259, 270, 589
See application file for complete search history.

(56) References Cited

U.S. PATENT DOCUMENTS

| | | | |
|---|---|---|---|
| 2002/0137291 A1* | 9/2002 | Zandt In't et al. | 438/270 |
| 2004/0188751 A1* | 9/2004 | Lin | 257/315 |
| 2007/0284657 A1* | 12/2007 | Sumida | 257/328 |

* cited by examiner

*Primary Examiner* — Wai Sing Louie
(74) *Attorney, Agent, or Firm* — Muncy, Geissler, Olds & Lowe, PLLC

(57) ABSTRACT

A method for forming a buried split word line structure is provided. The method comprises the following steps. At first, a substrate having a trench therein is provided. Two liners are formed to a first thickness on sidewalls of the trench. Then, the trench is filled with a first insulating layer to a first height. The two liners are removed. Finally, a conductive material is deposited to a second height between and adjacent to the first insulating layer and the trench. Here, the first height is greater than the second height.

19 Claims, 18 Drawing Sheets

SPLIT WORD LINE FABRICATION PROCESS

BACKGROUND OF THE INVENTION

1. Field of the Invention

The invention relates generally to the fabrication of semiconductor integrated circuit structures, and more particularly to the formation of buried split word line structures in memory cells.

2. Description of the Related Art

Semiconductor memories store bits of information in arrays of memory cells. For example, a dynamic random access memory (DRAM) cell typically includes an access field effect transistor (FET) and a storage capacitor. Some types of memory cells have buried word and bit lines. Memory cell word and bit lines may be buried by forming trenches in a semiconductor substrate and filling the trench with metal. Storage capacitors can be formed on the substrate surface or in the metal layers disposed above the substrate. For example, some types of DRAM cells have buried split word lines formed above buried bit lines. The buried split word lines extend in trenches orthogonal to the buried bit lines.

In fabricating semiconductor devices such as DRAMs, buried split word line structure is used to provide the memory cells in the adjacent rows for separately gating the access FETs therein. FIGS. 1A-E describe various processing techniques of a method of fabricating a buried split word line structure according to prior art. Referring to FIG. 1A, a crystalline silicon substrate 102 is covered with a layer of pad nitride 104, such as silicon nitride ($Si_3N_4$). Here, the pad nitride 104 serves as a hard mask. A photoresist (not shown) is deposited over the hard mask. The photoresist is exposed, patterned and etched to remove exposed portions. Then, the semiconductor wafer 100 is exposed to an etch process to transfer the photoresist pattern to the hard mask. Portions of the wafer 100 not covered by the hard mask are etched to form word line trenches within the wafer 100 using the hard mask to pattern the word line trenches. The substrate 102 is etched off to a preset depth, which forms the word line trenches 120. The photoresist is then removed prior to any further processing steps.

Referring to FIG. 1B, gate oxide (silicon dioxide, $SiO_2$) 106 is formed on the exposed sidewalls 122 and bottom portions 124 in respective trenches 120, such as by In-situ steam generation (ISSG) oxidation. A glue layer 108, such as TiN, is formed on gate oxide 106. A conductive layer 110 is then formed over the working surface of the wafer 100, including filling the word line trenches 120 by chemical vapor deposition (CVD) of a refractory metal, such as tungsten or polysilicon. The working surface is then planarized, such as by chemical mechanical polishing/planarization (CMP). The glue layer 108 and the conductive layer 110 are dry etched (RIE) to form recesses in the word line trenches 120.

Referring to FIG. 1C, an oxide layer 112 is then deposited to fill the trenches 120. Portions of the oxide layer 112 are removed, such as by isotropic etching, leaving oxide spacers 112a and 112b along sidewalls 122 of the trenches 120. Afterward, the trenches 120 are etched through the conductive layer 110 and the glue layer 108 and particularly into the substrate 102 to form recesses in the substrate 102. Thus, the conductive layer 110 is split into two halves 110a and 110b and the glue layer 108 is split into two halves 108a and 108b along sidewalls 122 of the trenches 120 as shown in FIG. 1D. In FIG. 1E, isolation material 114, such as oxide, is formed over the working surface of the wafer 100, filling the trenches 120. CMP or other suitable planarization process is used to remove portions of isolation material 114 above the nitride layer 104.

In general, the height y of the split word lines (110a and 110b) is related to the channel length of the access FET while the width x of the split word lines (110a and 110b) is related to the sheet resistance of the gate region as shown in FIG. 1E. The etched depth of the glue layer 108 and the conductive layer 110 determine the height y of the split word lines. Consistency of the etched depth of the glue layer 108 and the conductive layer 110 depends on the capability of manufacturing equipments. In other words, the height y may vary greatly from equipment to equipment. On the other hand, both the thickness of the oxide spacers 112a and 112b and the lateral etching rate during the above tungsten/silicon etching process determine the width x of the split word lines. However, it is difficult to precisely control the above factors during etching processes. Thus, there is a need in the art to provide a more stable and consistent dimension of the buried split word line structure.

SUMMARY OF THE INVENTION

In view of the above-mentioned problems, an object of the invention is to provide a method for forming a buried split word line structure to ensure a more stable and consistent dimension of the buried split word line structure.

According to an embodiment of the invention, a method for forming a buried split word line structure is provided. The method comprises the following steps. At first, a substrate having a trench therein is provided. Then, a conductive material conformal to the trench is formed. A first insulating layer within the trench adjacent the conductive material is deposited. Next, the first insulating layer is etched back to a first etched depth. The conductive material is etched back to a second etched depth in accordance with the first etched depth to thereby form a U-shaped gate conductor. Then, a second insulating layer is deposited above the U-shaped gate conductor and conformal to the trench. Finally, portions of a third insulating layer, the U-shaped gate conductor and the substrate are etched away to form a recess in substrate so that the U-shaped gate conductor is split into two halves. Here, the third layer is formed above the U-shaped gate conductor and the second etched depth is greater than the first etched depth.

According to another embodiment of the invention, a method for forming a buried split word line structure is provided. The method comprises the following steps. At first, a substrate having a trench therein is provided. Two liners are formed to a first thickness on sidewalls of the trench. Then, the trench is filled with a first insulating layer to a first height. The two liners are removed. Finally, a conductive material is deposited to a second height between and adjacent to the first insulating layer and the trench. Here, the first height is greater than the second height.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

A description of preferred embodiments of the present invention will be discussed, followed by a discussion of some advantage of the invention. Only one trench is shown in each figure, although many trenches and other components of a memory cell are present in the semiconductor memories.

Figure 2:
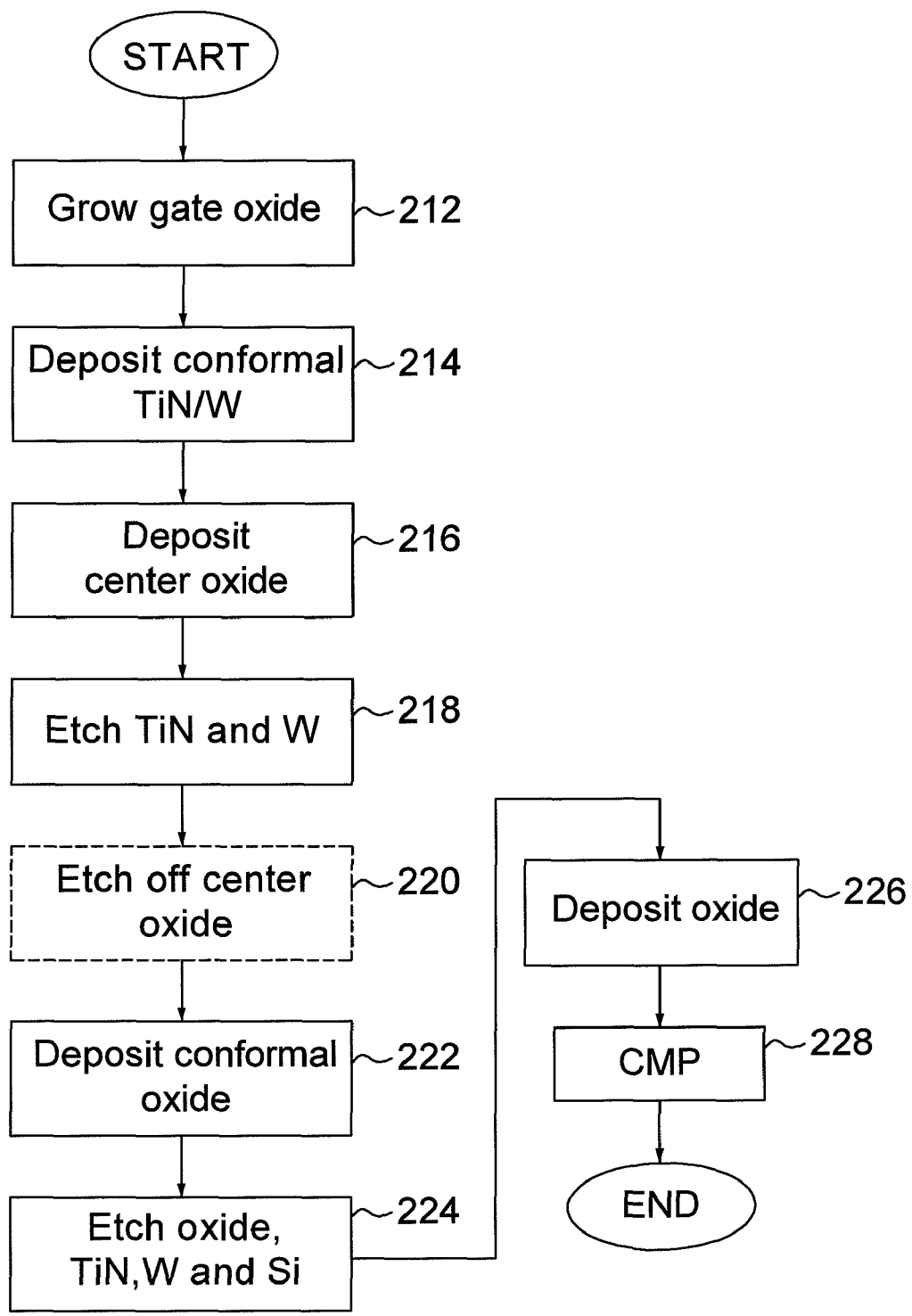
FIG. 2 is a flow chart illustrating a method for forming a buried split word line structure in accordance with an embodiment of the invention.

FIG. 2 is a flow chart illustrating a method for forming a buried split word line structure in accordance with an embodiment of the invention. FIGS. 3A-G describe generally various processing techniques of a method of fabricating a buried split word line structure with reference to FIG. 2. The steps of FIG. 2 are illustrated in FIGS. 3A-G.

Figure 1A:
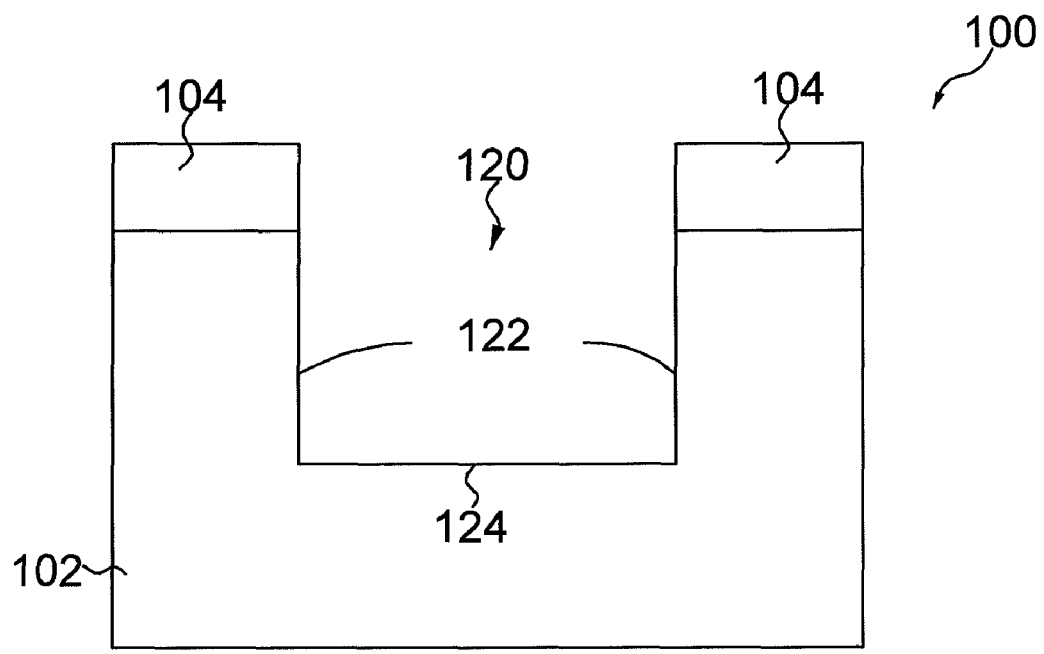
FIGS. 1A-E describe generally various processing techniques of a method of fabricating a buried split word line structure according to prior art.
Figure 1B:
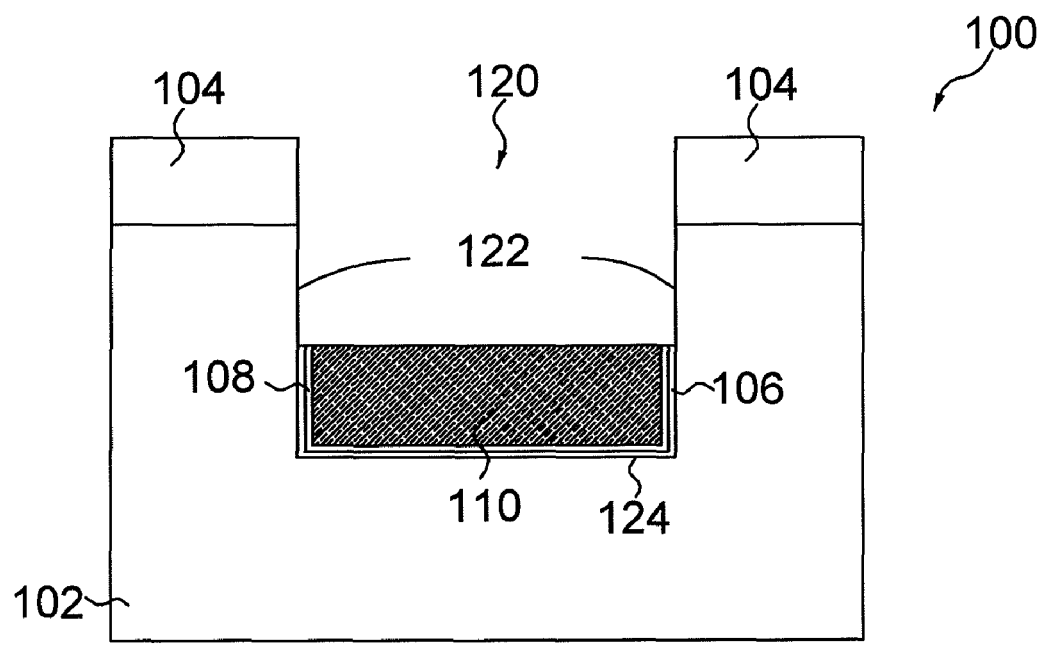
Figure 1C:
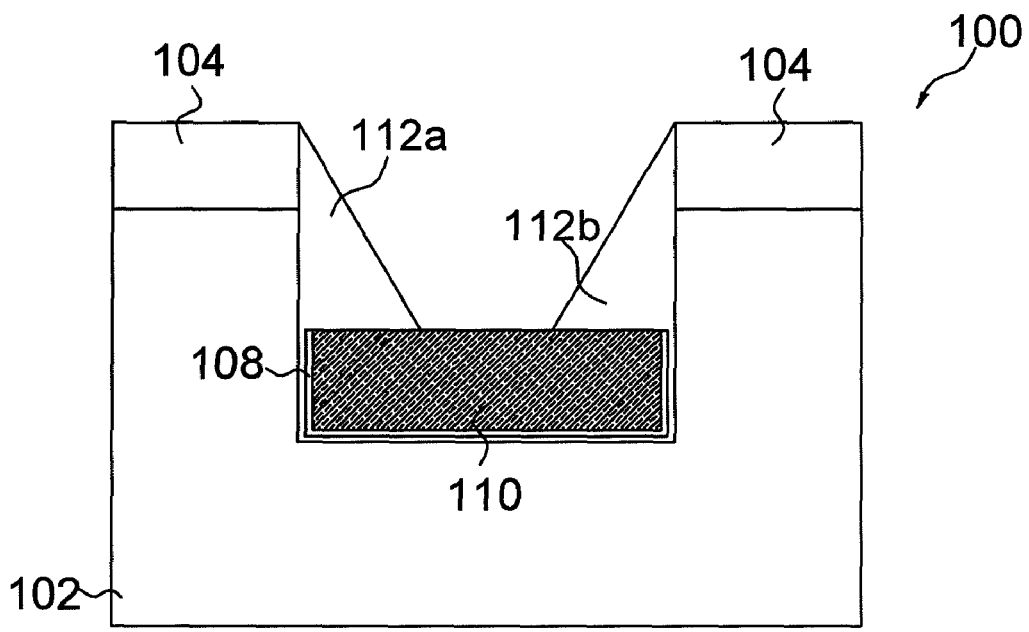
Figure 1D:
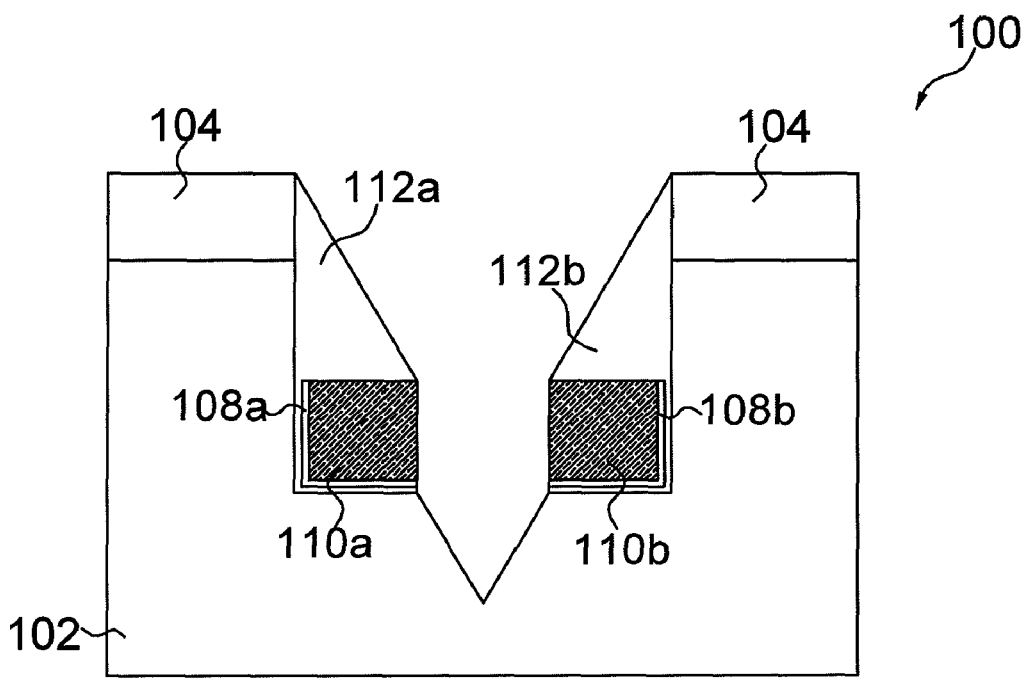
Figure 1E:
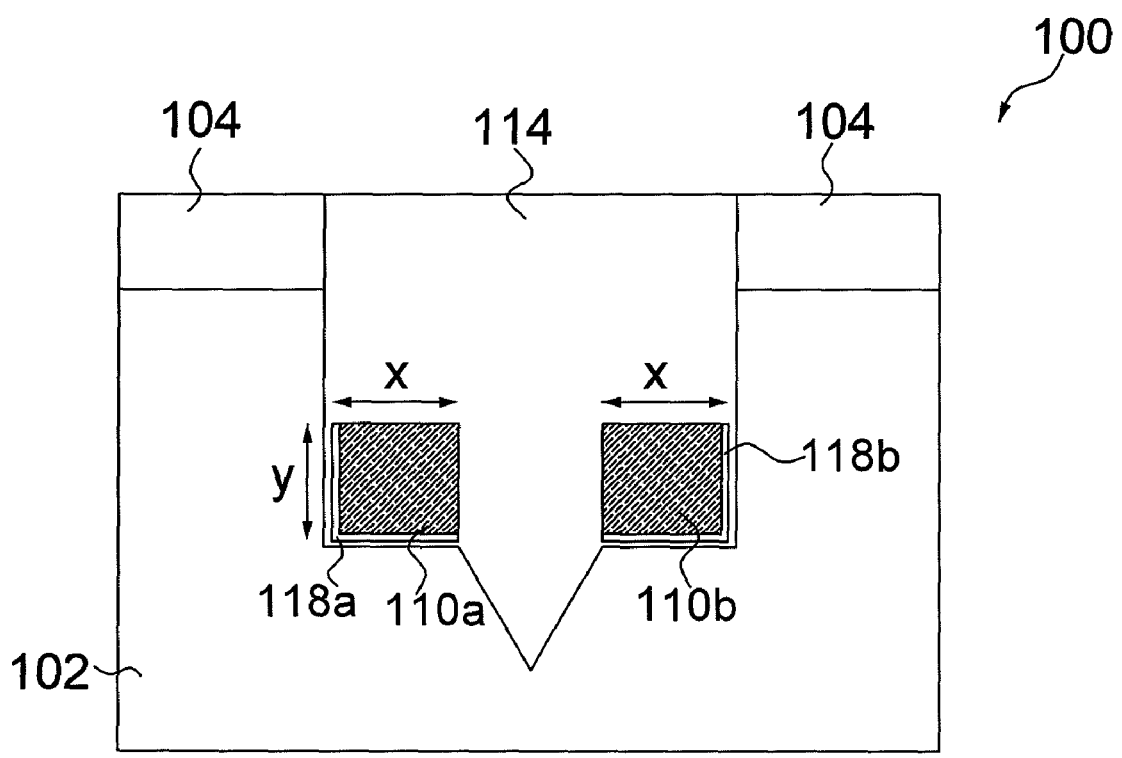
Figure 3A:
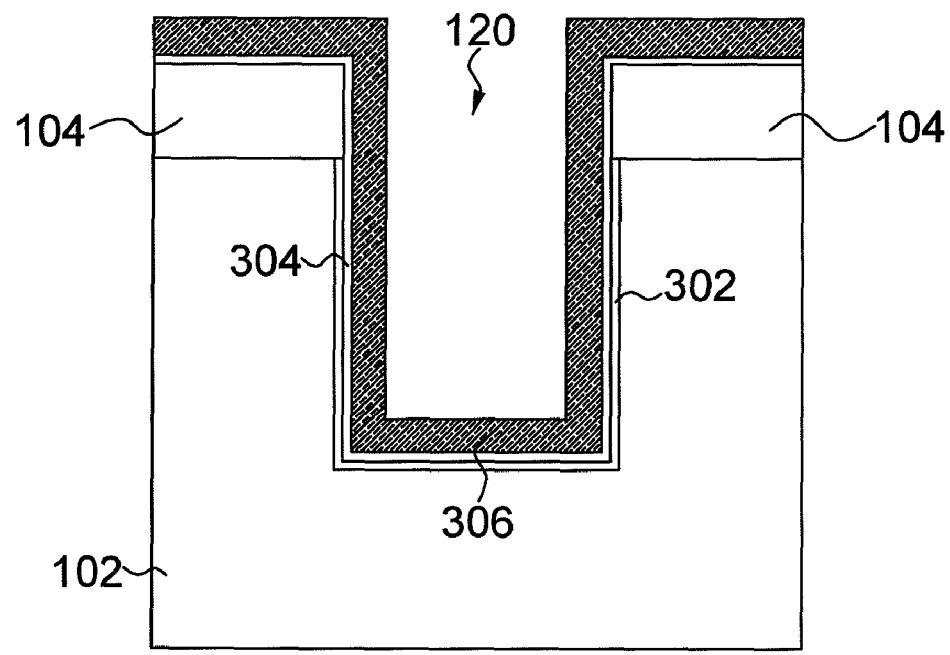
FIGS. 3A-G describe generally various processing techniques of a method of fabricating a buried split word line structure with reference to FIG. 2.

In FIG. 3A, the processing steps described above with respect to FIG. 1A have been carried out. Gate oxide 302 is grown on the exposed sidewalls 122 and bottom portions 124 in respective trenches 120 in step 212. A conformal glue layer 304, such as TiN, is deposited to a first thickness on gate oxide 302, such as by atomic layer deposition (ALD). A conformal conductive layer 306, such as tungsten or polysilicon, is then deposited to a second thickness on the glue layer 304, such as by ALD, to form a word line structure in step 214. Other suitable conductive materials could also be used. In step 214, the first thickness of the conformal glue layer 304 and the second thickness of the conductive layer 306 are equivalent to the width x of the split word lines, so they are well defined before ALD is performed. It should be noted that ALD is only utilized as embodiments and not limitation of the invention. In the actual implementations, any other depositions that can be used to form the above conformal glue layer 304 and conformal conductive layer 306 also fall in the scope of the invention.

Figure 3B:
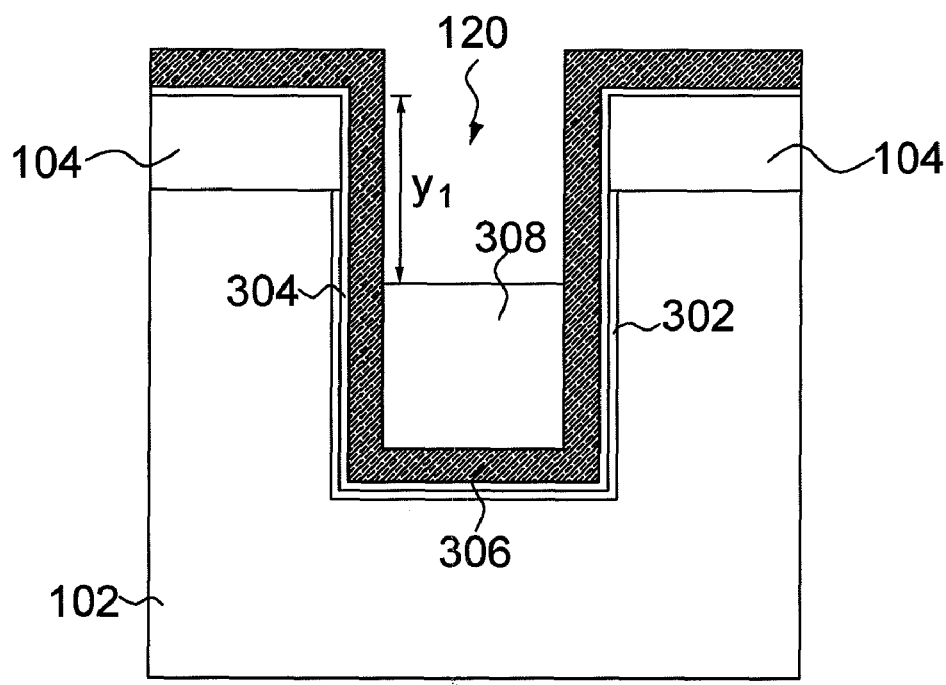

Next, in step 216, center oxide 308 is formed over the working surface of the wafer 300, including filling the trenches 120. CMP or other suitable planarization process is used to remove portions of center oxide 308 above conductive layer 306. Center oxide 308 is then recessed back to a depth of y1 in the trenches 120 by wet chemical etching, such as in a solution of hydrofluoric acid (HF), as shown in FIG. 3B. The etched depth y1 of center oxide 308 is measured prior to any further processing steps.

Figure 3C:
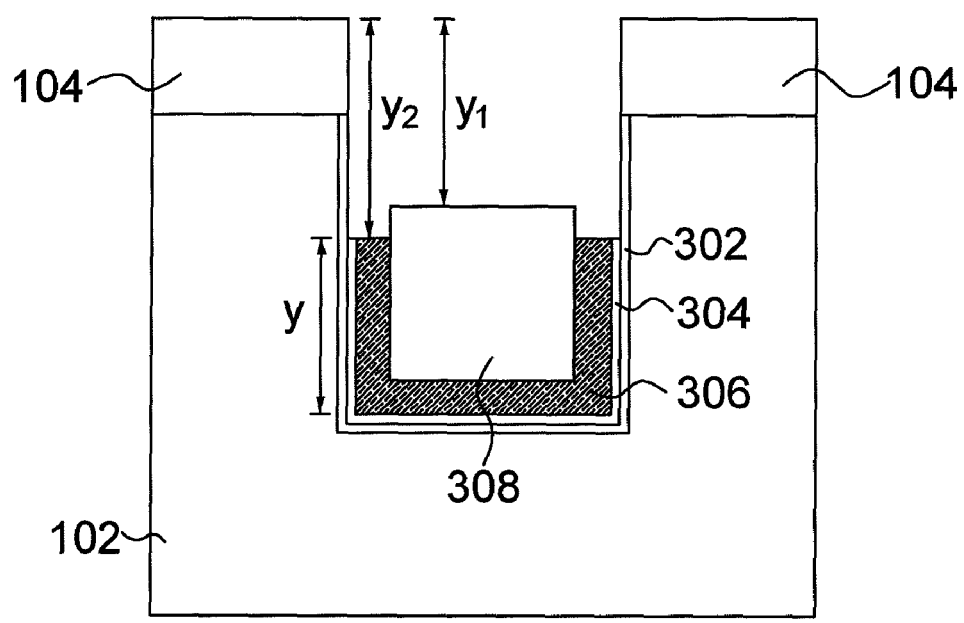

Then, in step 218, according to the etched depth y1 of the oxide recesses as shown in FIG. 3C, the glue layer 304 and the conductive layer 306 are recessed back to a etched depth y2 by wet chemical etching, such as in a solution of HF. Here, the etched depth y2 is greater than the etched depth y1. According to the invention, the etched depth y1 of the oxide recesses is used as a reference level to dynamically adjust the etched depth y2 of the glue layer 304 and the conductive layer 306. For example, if the etched depth y1 is too deep, the manufacturing equipment is dynamically adjusted to etch the glue layer 304 and the conductive layer 306 to a relatively shallow depth. By contrast, if the etched depth y1 is too shallow, the manufacturing equipment is dynamically adjusted to etch the glue layer 304 and the conductive layer 306 to a relatively deep depth. Here, the depth y2 increases as the etched depth y1 decreases. In this way, independent of the capability of the manufacturing equipments, the height y of word lines is determined by the two processing steps 216 and 218.

Figure 3D:
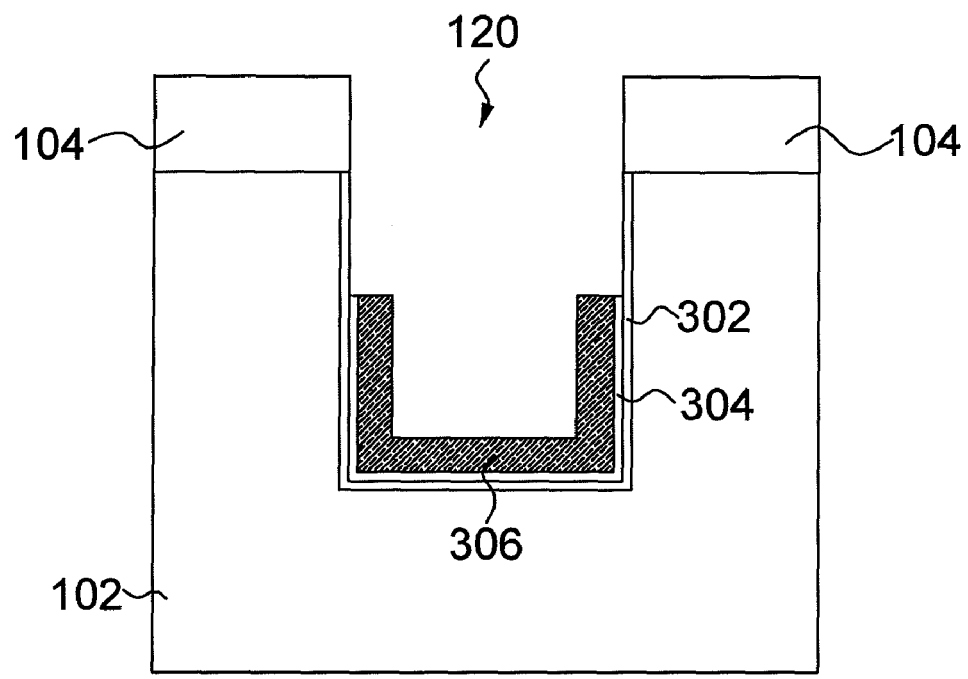
Figure 3E:
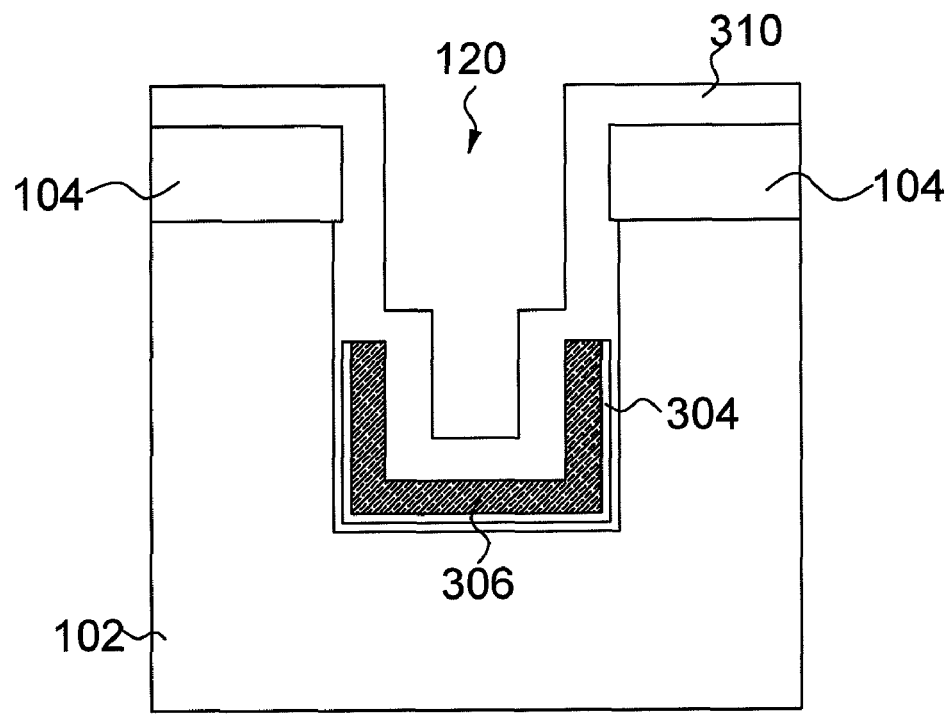
Figure 3F:
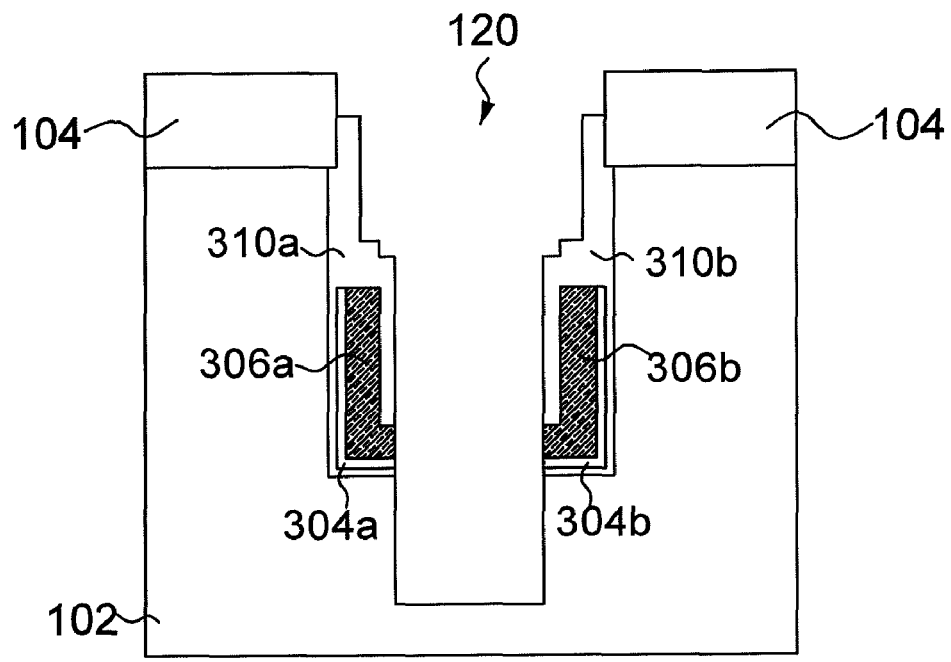
Figure 3G:
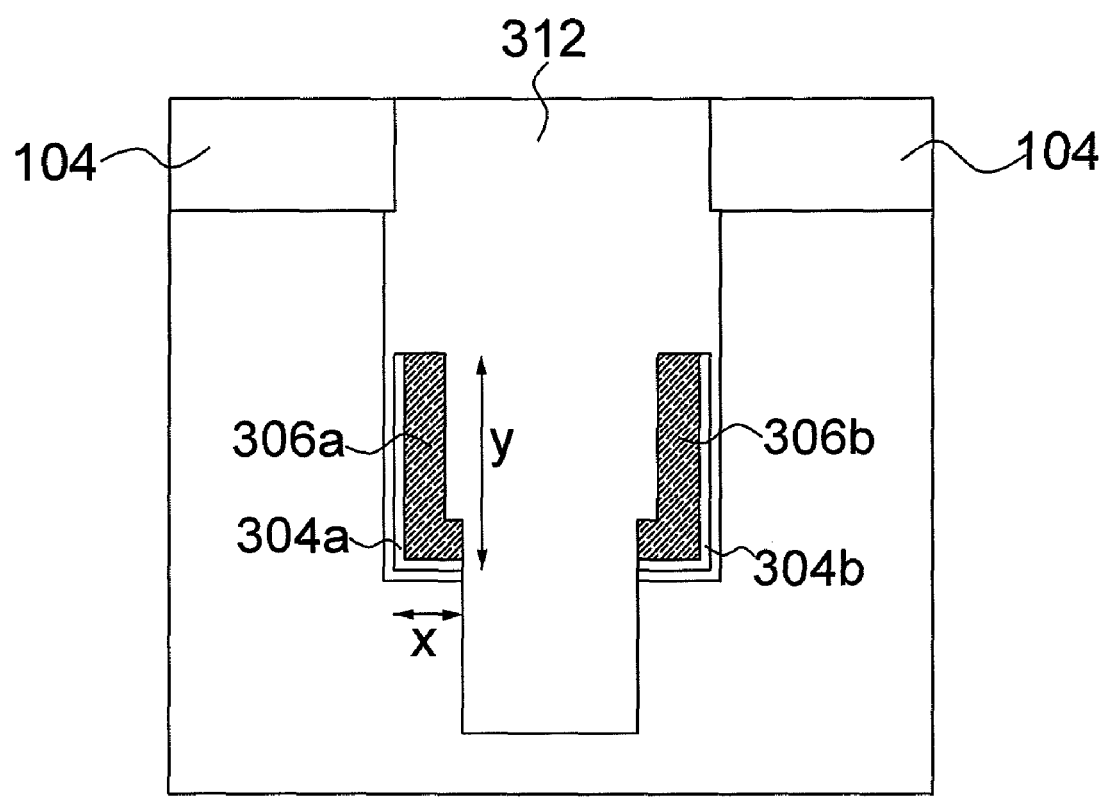

In step 220, center oxide 308 is removed by wet chemical etching, such as in a solution of HF, as shown in FIG. 3D. Then, in step 222, a conformal oxide layer 310 is formed over the trenches 120, such as by ALD, as shown in FIG. 3E. Next, in step 224, an oxide spacer etch is performed on the oxide layer 310, leaving oxide spacers 310a and 310b. Referring to FIG. 3F, the trenches 102 are etched through the oxide layer 310, the conductive layer 306, the glue layer 304 and particularly into the substrate 102 to form a pair of split word lines (306a and 306b) and a pair of split glue layers (304a and 304b). Next, in step 226, isolation material 312, such as SiO$_2$, is deposited to fill the trenches 120. Finally, in step 228, CMP or other suitable planarization technique is used to remove portions of isolation material 312 above the surface of the nitride layer 104 as shown in FIG. 3G.

Figure 4A:
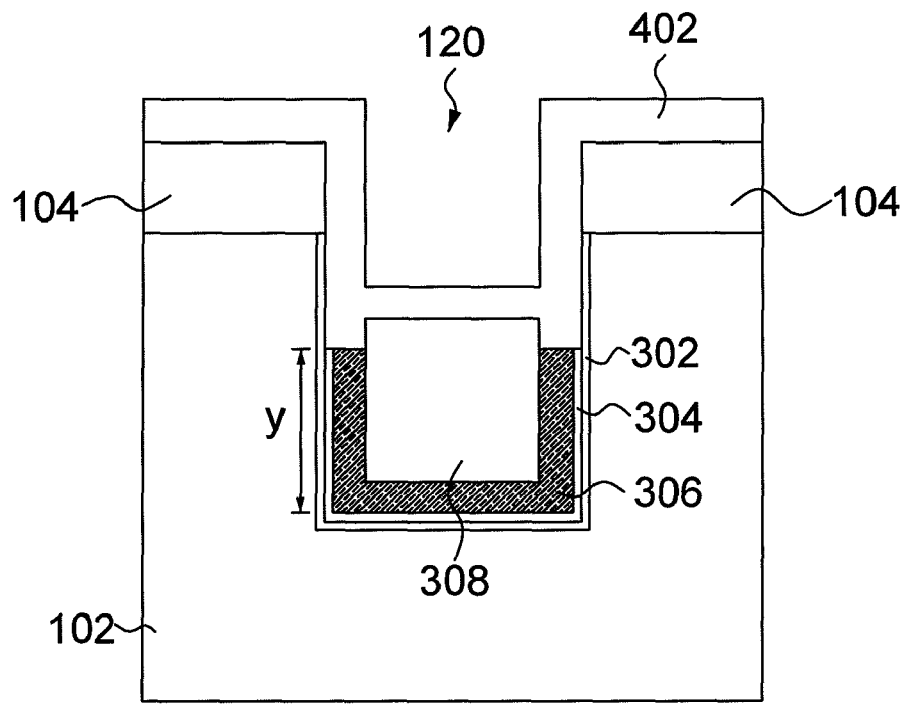
FIGS. 4A-4B illustrate additional steps used to form the buried split word line structure according to another embodiment.
Figure 4B:
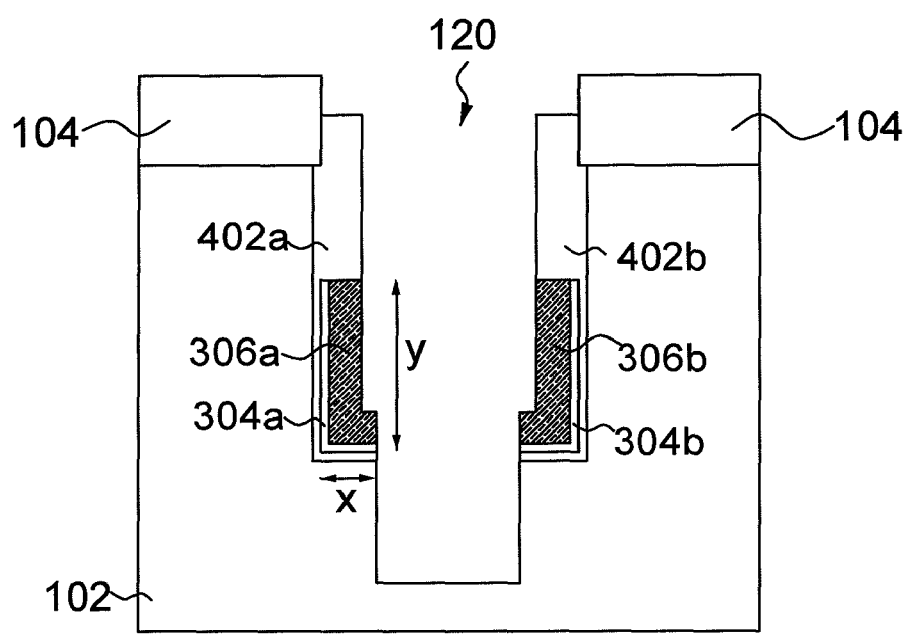

It should be noted that the step 220 is optional. In an alternative embodiment, the step 220 is omitted from the flow chart of FIG. 2, thus representing in dotted lines in FIG. 2. FIGS. 4A-4B illustrate additional steps used to form the buried split word line structure according to another embodiment. As mentioned above, in an alternative embodiment, the step 220 is omitted from the flow chart of FIG. 2. Accordingly, the step 218 is directly followed by the process steps 222-228 described below with respect to FIGS. 4A-4B and 3G.

In FIG. 4A, a conformal oxide layer 402 is formed over the trenches 120 (step 222), such as by ALD. Since center oxide 308 is not removed in this embodiment, the depth of the opening of the trench 120 in FIG. 4A is shallower than that in FIG. 3E. Next, in step 224, an oxide spacer etch is performed on the oxide layer 402 and center oxide 308, leaving oxide spacers 402a and 402b. Referring to FIG. 4B, the trenches 120 are etched through the oxide layer 402, center oxide 308, the conductive layer 306, the glue layer 304 and particularly into the substrate 102 to form a pair of split word lines (306a and 306b) and a pair of split glue layers (304a and 304b). Next, in step 226, isolation material 312, such as SiO$_2$, is deposited to fill the trenches 120. Finally, in step 228, the working surface is planarized, such as by CMP, as shown in FIG. 3G.

In the above two embodiments, grouping control (steps 216 and 218) determines the height y of the split word lines (110a and 110b) and the step 214 (i.e., depositing conformal glue layer/conductive layer) determines the width x of the word line (110a or 110b). The lateral etching is significantly reduced during the whole processing steps. Compared with convention fabrication process, the invention provides a more stable and consistent dimension of the buried split word line structure.

Figure 5:
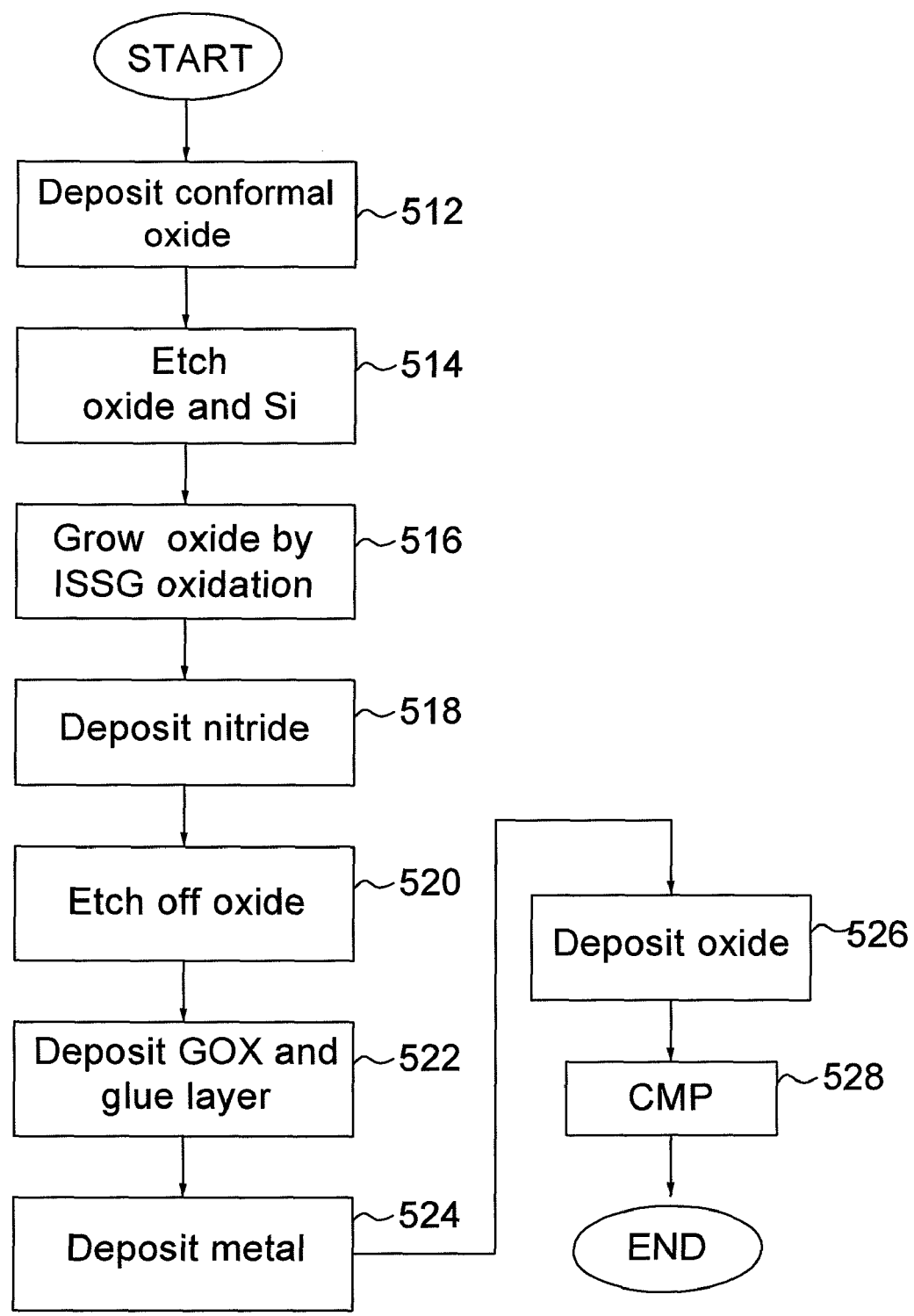
FIG. 5 is a flow chart illustrating a method for forming a buried split word line structure in accordance with another embodiment of the invention.

FIG. 5 is a flow chart illustrating a method for forming a buried split word line structure in accordance with another embodiment of the invention. FIGS. 6A-G describe generally various processing techniques of a method of fabricating a buried split word line structure with reference to FIG. 5. The steps of FIG. 5 are illustrated in FIGS. 6A-G.

Figure 6A:
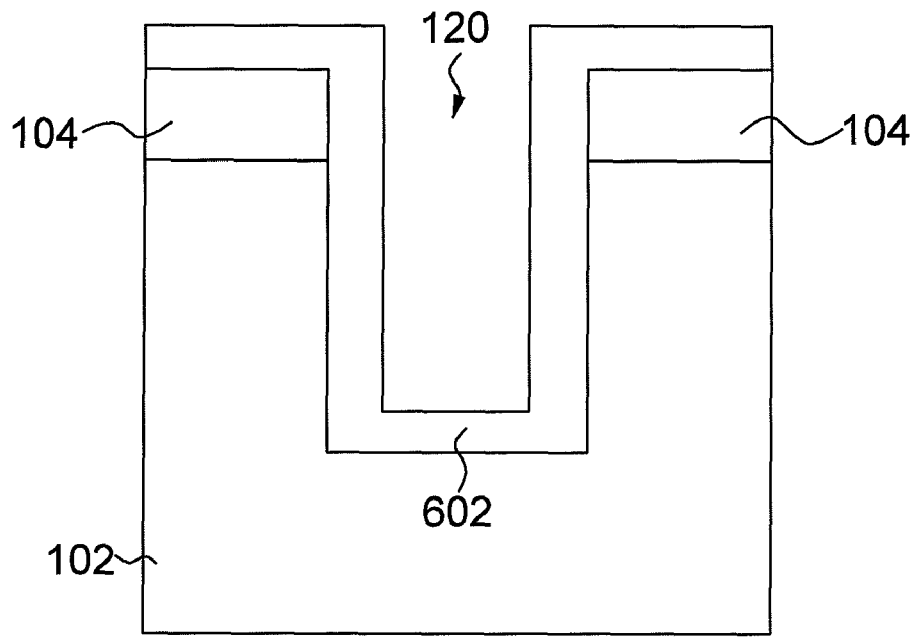
FIGS. 6A-G describe generally various processing techniques of a method of fabricating a buried split word line structure with reference to FIG. 5.

In FIG. 6A, the processing steps described above with respect to FIG. 1A have been carried out. A conformal insulating layer 602, such as oxide layer (hereinafter referred to as "conformal oxide layer 602"), is formed over the trenches 120, such as by ALD, in step 512. In this step, the thickness of the conformal oxide layer 602 determines the width x of the split word lines, so the thickness of the conformal oxide layer 602 needs to be well defined before ALD is performed. It should be noted that ALD is only utilized as embodiments and not limitation of the invention. In the actual implementations, any other depositions that can be used to form the above conformal insulating layer 602 also fall in the scope of the invention.

Figure 6B:
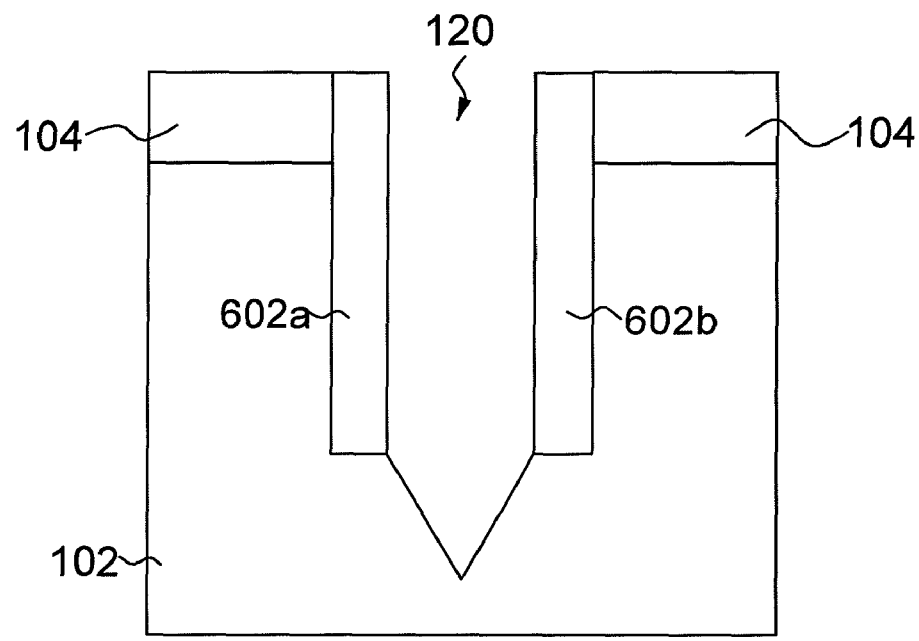
Figure 6C:
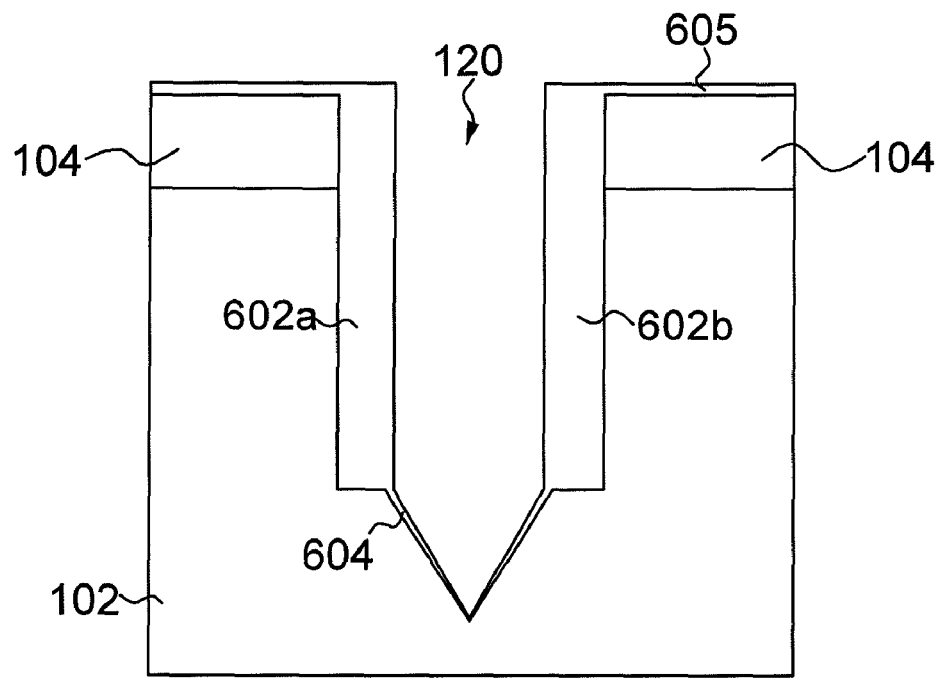
Figure 6D:
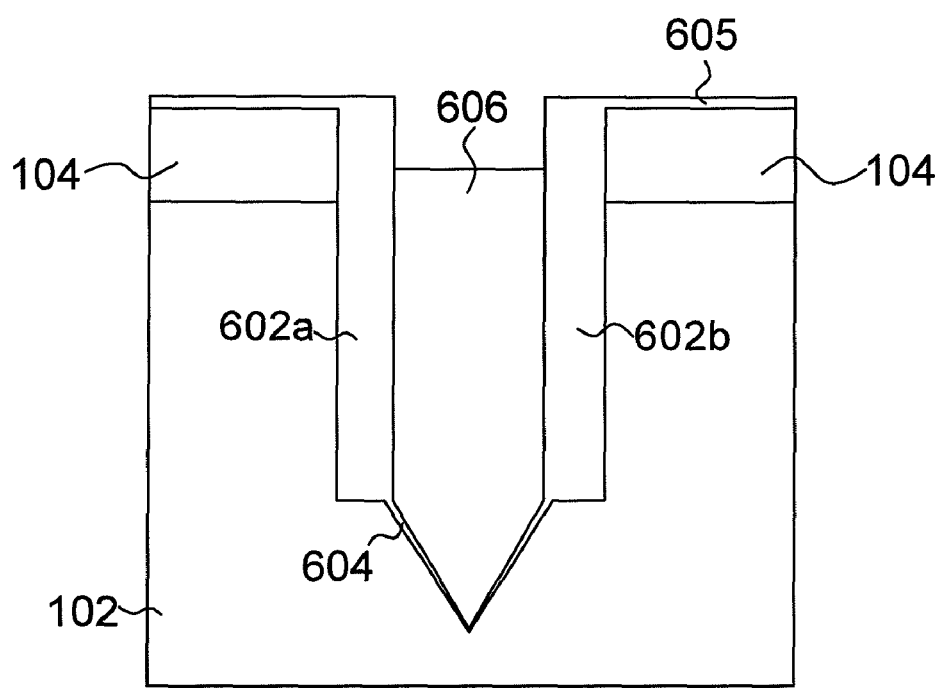

Next, in step 514, an oxide spacer etch is performed on the oxide layer 602 to form oxide spacers 602a and 602b as shown in FIG. 6B. The trenches 102 are etched through the oxide layer 602 and particularly into the substrate 102 to form recesses in the substrate 102. The next step 516 is to form bottom oxide 604 at the bottom of the recesses and top oxide 605 over the nitride layer 104, such as by In-situ steam generation (ISSG) oxidation as shown in FIG. 6C. Here, top oxide 605 serves to protect the nitride layer 104. Then, in step 518, center nitride 606 is deposited to fill the trenches 120. portions of center nitride 606 above the nitride layer 104 is removed by wet chemical etching, such as in a solution of Phosphoric acid ($H_3PO_4$). Center nitride 606 is then recessed back to a depth by wet chemical etching, such as in a solution of $H_3PO_4$, as shown in FIG. 6D. The shallower the etched depth, the better the isolation of the split word lines 610a and 610b. By contrast, the deeper the etched depth, the easier the deposition of the conductive layer 610.

Figure 6E:
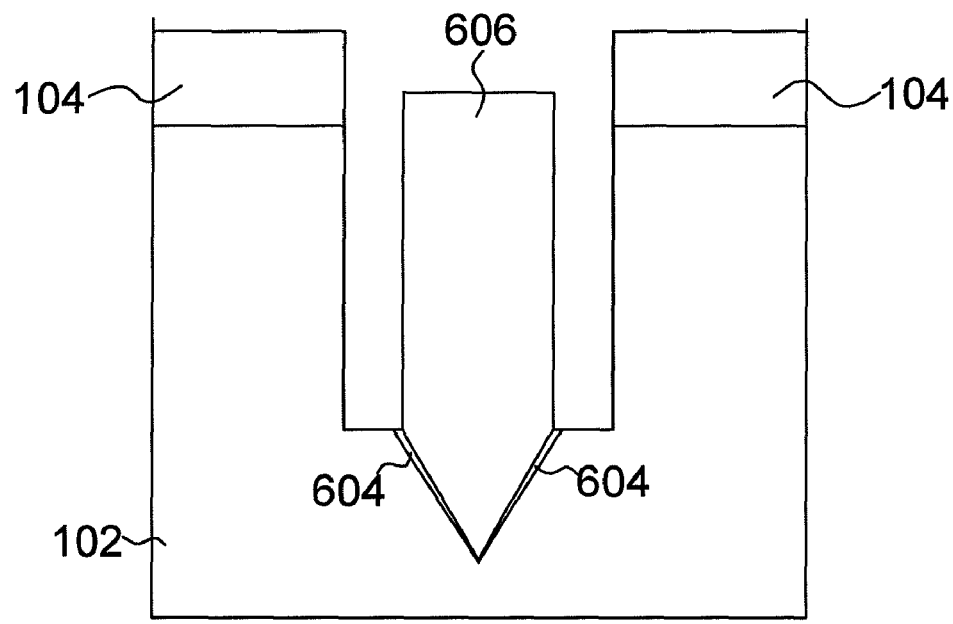
Figure 6F:
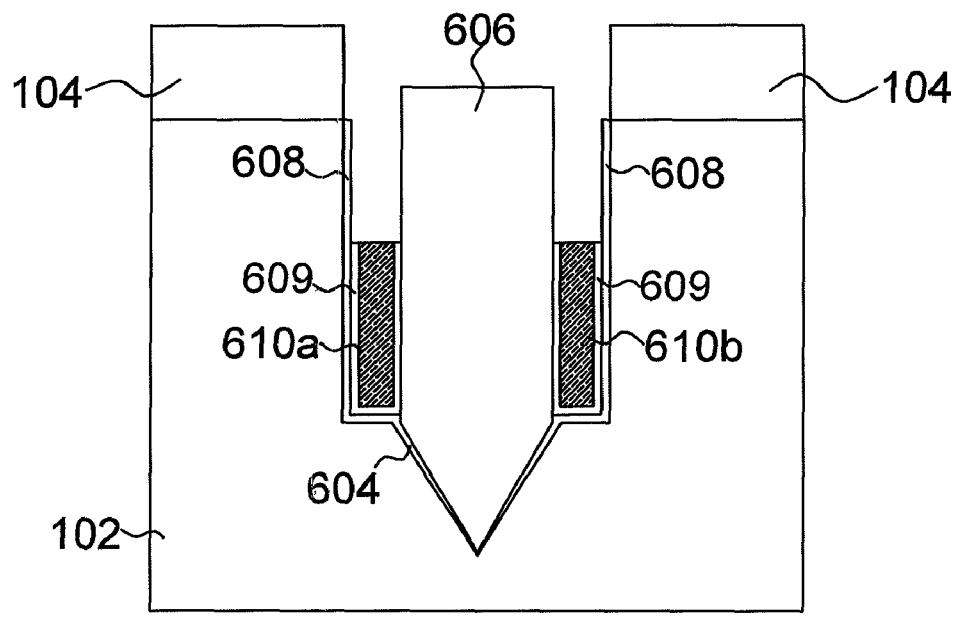
Figure 6G:
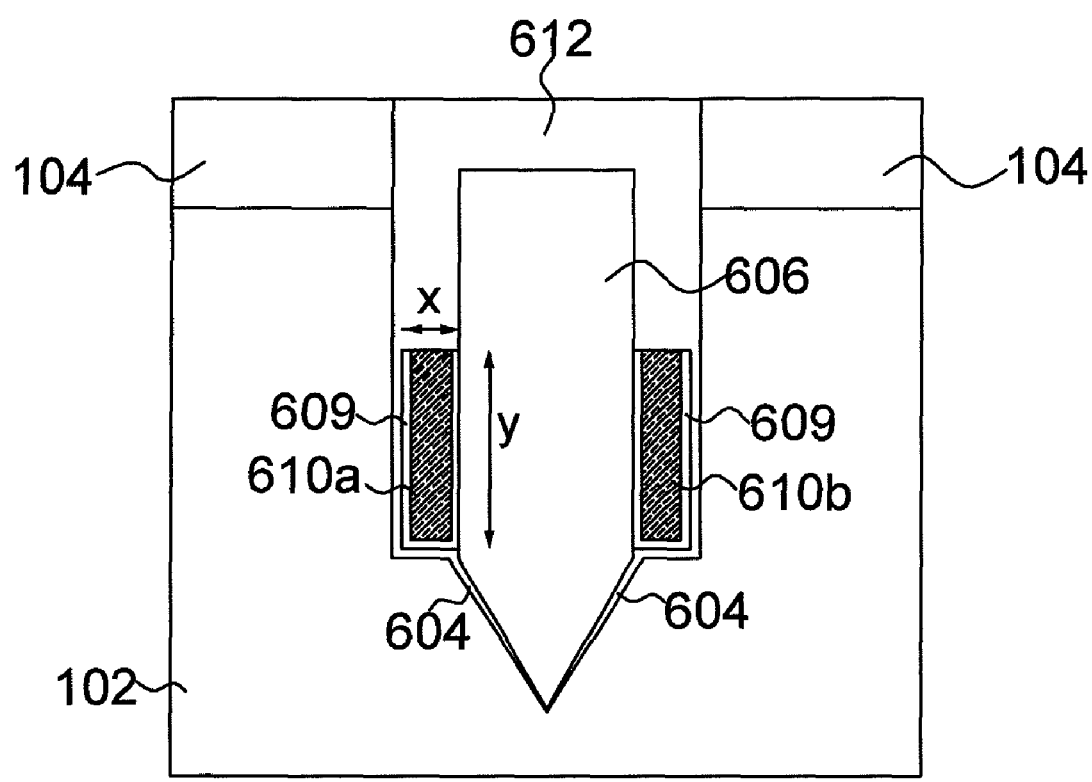

Then, in step 520, the oxide layer 602 and top oxide 605 are removed by wet chemical etch, such as in a solution of HF, as shown in FIG. 6E. Referring to FIG. 6F, the next step 522 is to form gate oxide 608 on the exposed sidewalls 122 and bottom portions 124 in respective trenches 120 and then form a glue layer 609, such as TiN, on gate oxide 608. Next, a conductive layer 610, such as tungsten or polysilicon, is deposited to fill the trenches 120. The conductive layer 610 is then etched back to form buried split word lines 610a and 610b in the trenches 120. Next, in step 526, isolation material 612, such as $SiO_2$, is deposited to fill the trenches 120. Finally, in step 528, the working surface is planarized, such as by CMP, as shown in FIG. 6G.

Figure 7:
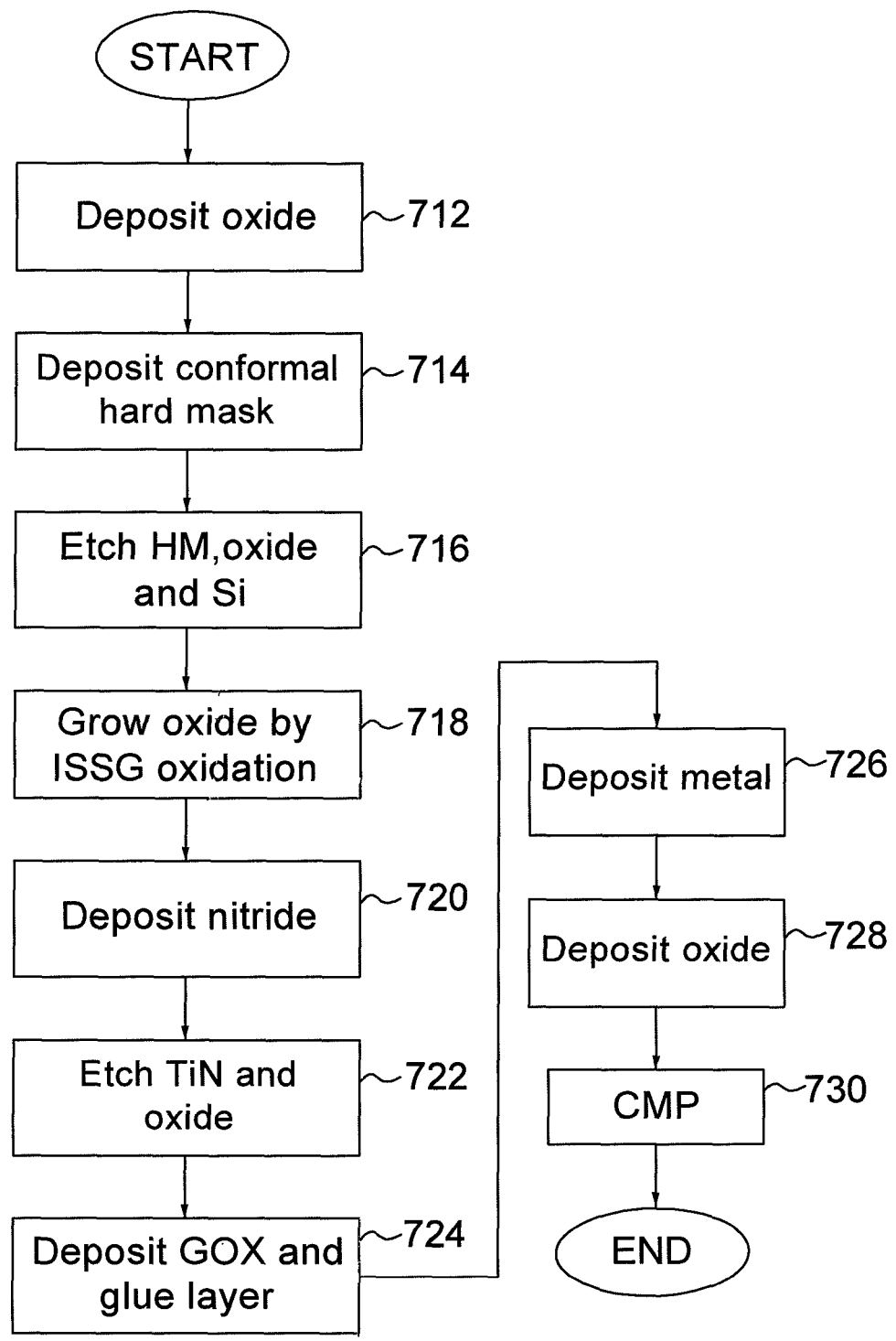
FIG. 7 is a flow chart illustrating a method for forming a buried split word line structure in accordance with another embodiment of the invention.

FIG. 7 is a flow chart illustrating a method for forming a buried split word line structure in accordance with another embodiment of the invention. FIGS. 8A-F describe generally various processing techniques of a method of fabricating a buried split word line structure with reference to FIG. 7. The steps of FIG. 7 are illustrated in FIGS. 8A-F.

Figure 8A:
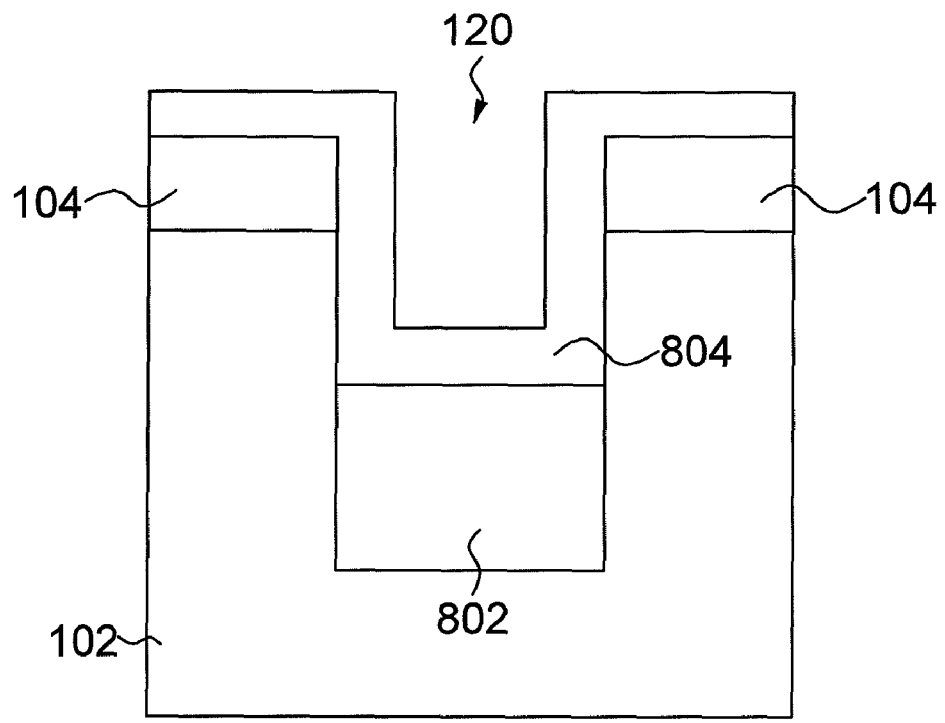
FIGS. 8A-F describe generally various processing techniques of a method of fabricating a buried split word line structure with reference to FIG. 7.

In FIG. 8A, the processing steps described above with respect to FIG. 1A have been carried out. In step 718, an insulating layer 802 (e.g., oxide, hereinafter referred to as "oxide layer 802") is deposited to fill the trenches 120. CMP or other suitable planarization process is used to remove portions of the oxide layer 802 above the nitride layer 104. The oxide layer 802 is then etched back to form recesses in the trenches 102. Afterward, a conformal hard mask 804, such as titanium nitride (TiN), is formed over the trenches 102, such as by ALD, in step 714. In this step, the thickness of the hard mask 804 determines the width x of the split word lines, so the thickness of the conformal hard mask 804 needs to be well defined before ALD is performed. It should be noted that TiN and ALD are utilized as embodiments and not limitations of the invention. In the actual implementations, other suitable materials could also be used as hard mask and any other depositions that can be used to form the above conformal hard mask 804 also fall in the scope of the invention.

Figure 8B:
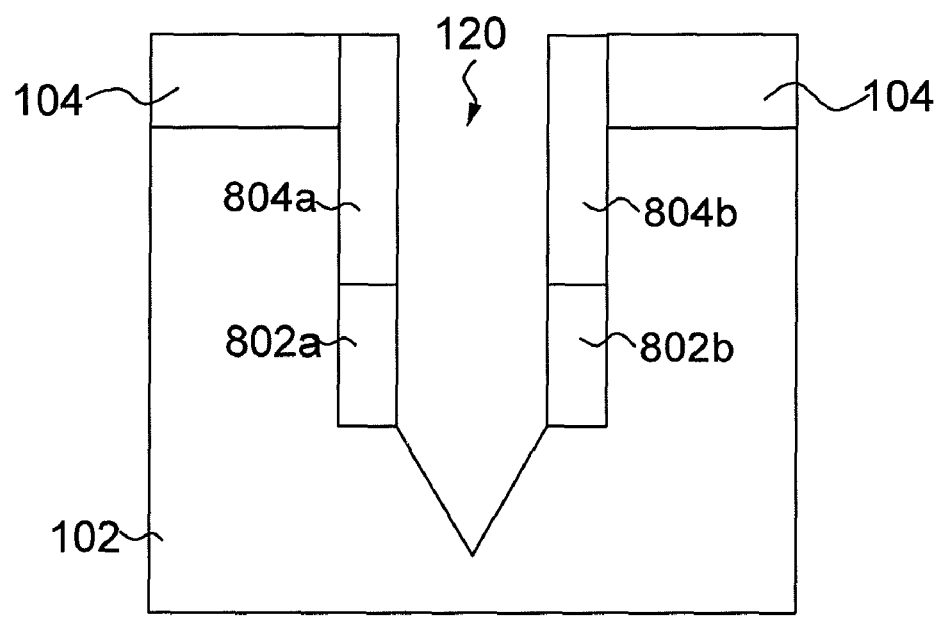
Figure 8C:
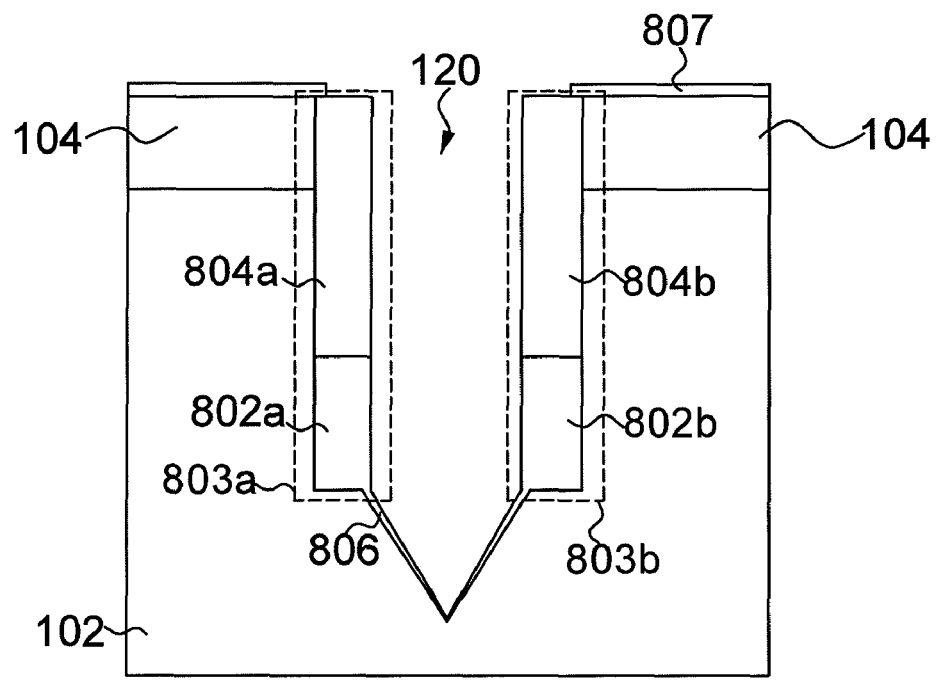
Figure 8D:
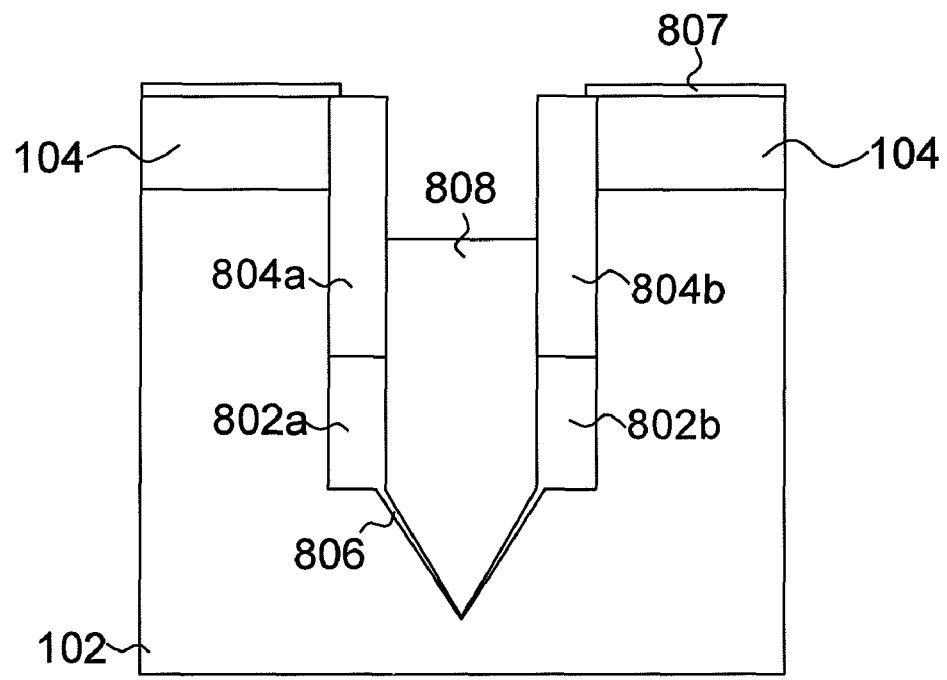

In step 716, referring to FIG. 8B, a spacer etch is performed on the hard mask 804 to form spacers 804a and 804b. The trenches 120 are etched through the hard mask 804 and the oxide layer 802 and particularly into the substrate 102 to form recesses in substrate 102. The next step 718 is to form bottom oxide 806 at the bottom of the recesses and top oxide 807 over the nitride layer 104, such as by ISSG oxidation as shown in FIG. 8C. Here, top oxide 807 serves to protect the nitride layer 104. Then, in step 720, center nitride 808 is deposited to fill the trenches 120. Portions of center nitride 808 above the nitride layer 104 is removed by wet chemical etching, such as in a solution of Phosphoric acid ($H_3PO_4$). Center nitride 808 is then recessed back to a depth by wet chemical etching, such as in a solution of $H_3PO_4$, as shown in FIG. 8D. The shallower the etched depth, the better the isolation of the split word lines 810a and 810b. By contrast, the deeper the etched depth, the easier the deposition of the conductive layer 810.

Figure 8E:
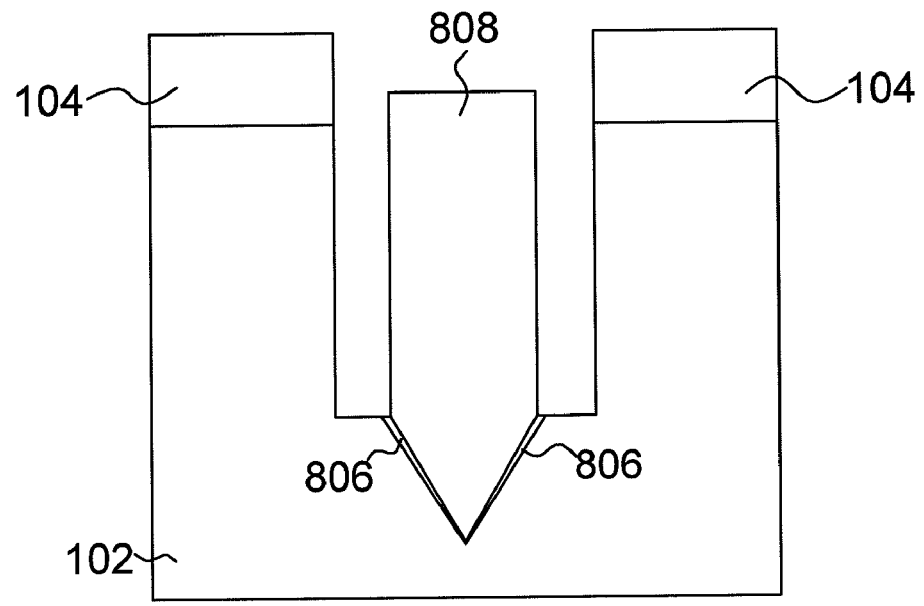
Figure 8F:
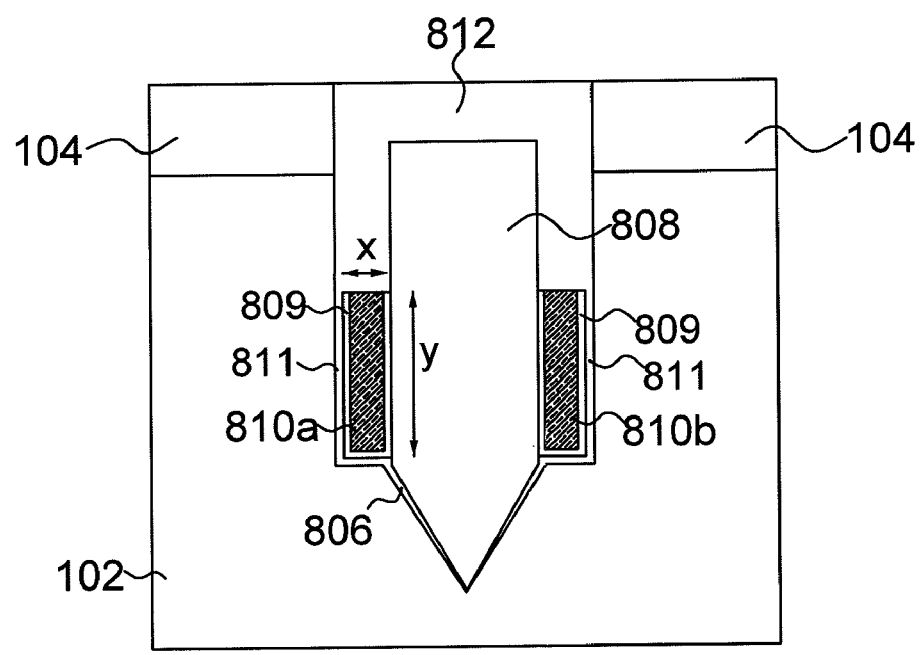

Then, in step 722, the oxide layer 802, the hard mask 804, and top oxide 807 are removed, such as by wet etch, such as in a solution of HF, as shown in FIG. 8E. Referring to FIG. 8F, the next step 724 is to form gate oxide 811 on the exposed sidewalls 122 and bottom portions 124 in respective trenches 120 and then form a glue layer 809, such as TiN, on gate oxide 811. Next, a conductive layer 810, such as tungsten or polysilicon, is deposited to fill the trenches 120, in step 726. The conductive layer 810 is then etched back to form buried split word lines 810a and 810b in the trenches 120. Next, in step 728, isolation material 812, such as $SiO_2$, is deposited to fill the trenches 120. Finally, in step 730, the working surface is planarized, such as by CMP, as shown in FIG. 8F.

As can be observed from FIG. 6C, a liner (602a or 602b) along each sidewall 122 of the trench 120 comprises an oxide layer 602 only. By comparison, in FIG. 8C, a liner (803a or 803b) along each sidewall 122 of the trench 120 comprises two layers, namely an oxide layer (802a or 802b) and a hard mask (804a or 804b). In operation, since the etching process of the oxide layer 802 does not affect the hard mask layer 804, the profile of the hard mask spacers 804a and 804b is better than that of the oxide spacers 602a and 602b. With respect to the embodiments of FIGS. 5 and 7, it should be noted that the invention is not limited to the number of layers forming the liner. In the actual implementations, other suitable number of layers, such as three layers, could also be used to form the liner. In the embodiment of FIGS. 5 and 7, the width x of the split word lines is defined in steps 512 and 714, respectively, such as by ALD. After buried split word lines are formed or deposited in the trenches 120 (in steps 524 and 726), no further etching process will affect the width x of the split word lines.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A method for forming a buried split word line structure, comprising:
   providing a substrate having a trench therein;
   forming a conductive material conformal to the trench;
   depositing a first insulating layer within the trench adjacent the conductive material;
   etching the first insulating layer to a first etched depth;
   etching the conductive material to a second etched depth in accordance with the first etched depth to thereby form a U-shaped gate conductor;
   depositing a second insulating layer above the U-shaped gate conductor and conformal to the trench; and
   etching away portions of a third insulating layer, the U-shaped gate conductor and the substrate to form a recess in substrate so that the U-shaped gate conductor is split into two halves;
   wherein the third layer is formed above the U-shaped gate conductor and the second etched depth is greater than the first etched depth.

2. The method according to claim 1, wherein the step of forming the conductive layer comprises:
   forming a fourth insulating layer to a first thickness conformal to the trench;
   forming a glue layer to a second thickness over the fourth insulating layer; and
   forming the conductive material to a third thickness over the glue layer.

3. The method according to claim 2, wherein the step of forming the conductive material to the third thickness over the glue layer comprises forming the conductive material to the third thickness over the glue layer by atomic layer deposition (ALD).

4. The method according to claim 2, wherein the first thickness, the second thickness and the third thickness are related to a width of the buried split word line structure.

5. The method according to claim 1, wherein the second etched depth determines a height of the split word line structure.

6. The method according to claim 1, wherein the second insulating layer is deposited further above the first insulating layer and the third insulating layer comprises the first insulating layer and the second insulating layer.

7. The method according to claim 1, wherein the step of etching the conductive material comprises:
   etching the glue layer to the second etched depth; and
   etching the conductive material to the second etched depth to thereby form the U-shaped gate conductor, wherein the surface of the glue layer is substantially coplanar with the surface of the U-shaped gate conductor.

8. The method according to claim 1, wherein the second etched depth increases as the first etched depth decreases.

9. The method according to claim 1, further comprising:
   removing the first insulating layer before depositing the second insulating layer;
   wherein the third insulating layer comprises the second insulating layer.

10. A method for forming a buried split word line structure, comprising:
    providing a substrate having a trench therein;
    forming two liners to a first thickness on sidewalls of the trench;
    filling the trench with a first insulating layer to a first height;
    removing the liners; and
    depositing a conductive material to a second height between and adjacent to the first insulating layer and the trench;
    wherein the first height is greater than the second height.

11. The method according to claim 10, wherein the step of forming the two liners comprises:
    filling the trench with a second insulating layer to a second thickness;
    forming a hard mask conformal to the trench and the second insulating layer to a third thickness; and
    etching away portions of the second insulating layer, the hard mask and the substrate to form a recess in the substrate;
    wherein a first material that forms the first insulating layer is different from a second material that forms the second insulating layer.

12. The method according to claim 10, wherein the first thickness is related to a thickness of the conductive material.

13. The method according to claim 11, wherein the third thickness is related to a thickness of the conductive material.

14. The method according to claim 11, wherein the step of forming the hard mask comprises forming the hard mask conformal to the trench and the second insulating layer to the third thickness by atomic layer deposition (ALD).

15. The method according to claim 10, wherein the step of forming the two liners comprises:
    forming a second insulating layer conformal to the trench to a second thickness; and
    etching away portions of the second insulating layer and the substrate to from a recess in the substrate;
    wherein the first insulating layer and the second insulating layer are different.

16. The method according to claim 15, wherein the first thickness is substantially equal to the second thickness.

17. The method according to claim 15, wherein the second thickness is related to a thickness of the conductive material.

18. The method according to claim 15, wherein the step of forming the second insulating layer comprises forming the second insulating layer conformal to the trench to the second thickness by atomic layer deposition (ALD).

19. The method according to claim 10, wherein each of the two liners comprises at least one layer.

* * * * *